United States Patent [19]
Kumada et al.

[11] Patent Number: 5,168,338
[45] Date of Patent: Dec. 1, 1992

[54] SOLID-STATE HYBRID INFRARED IMAGING DEVICE

[75] Inventors: Norimasa Kumada; Yoshihiro Hisa; Yasuaki Yoshida, all of Itami, Japan

[73] Assignee: Mitsubishi Denki Kabushiki Kaisha, Tokyo, Japan

[21] Appl. No.: 884,762

[22] Filed: May 18, 1992

[30] Foreign Application Priority Data

Sep. 30, 1991 [JP] Japan .................... 3-282126

[51] Int. Cl.$^5$ .................... H01L 29/78; H01L 27/14; H01L 31/00
[52] U.S. Cl. .................... 307/311; 257/226
[58] Field of Search ............ 357/24, 30; 377/57-63

[56] References Cited

U.S. PATENT DOCUMENTS

| | | | |
|---|---|---|---|
| 3,808,435 | 4/1974 | Bate et al. | 357/24 |
| 4,614,960 | 9/1986 | Bluzer | 357/24 |
| 4,994,876 | 2/1991 | Hsia | 357/24 |

FOREIGN PATENT DOCUMENTS 62-61357 3/1987 Japan .

OTHER PUBLICATIONS

"The Basis of the Solid-State Imaging Device" Jun. 10, 1982, p. 88.

Primary Examiner—Gene M. Munson
Attorney, Agent, or Firm—Leydig, Voit & Mayer

[57] ABSTRACT

A solid-state imaging device includes a photodiode array having a plurality of pixels, each pixel including a second conductivity type region formed in a first conductivity type semiconductor layer, an electrode common to all the pixels and disposed on the first conductivity type semiconductor layer, a signal transfer part for transferring signal charges generated in the pixels and a DC voltage source for applying a DC voltage in a forward direction to the pixels. The reverse bias voltage applied to a photodiode due to the voltage applied by the signal input stage of the signal transfer part is canceled by the forward DC voltage applied to the common electrode. As a result, the operating points of the pixels are uniform when nearly zero bias voltage is applied to the pixels.

6 Claims, 7 Drawing Sheets

F I G. 2
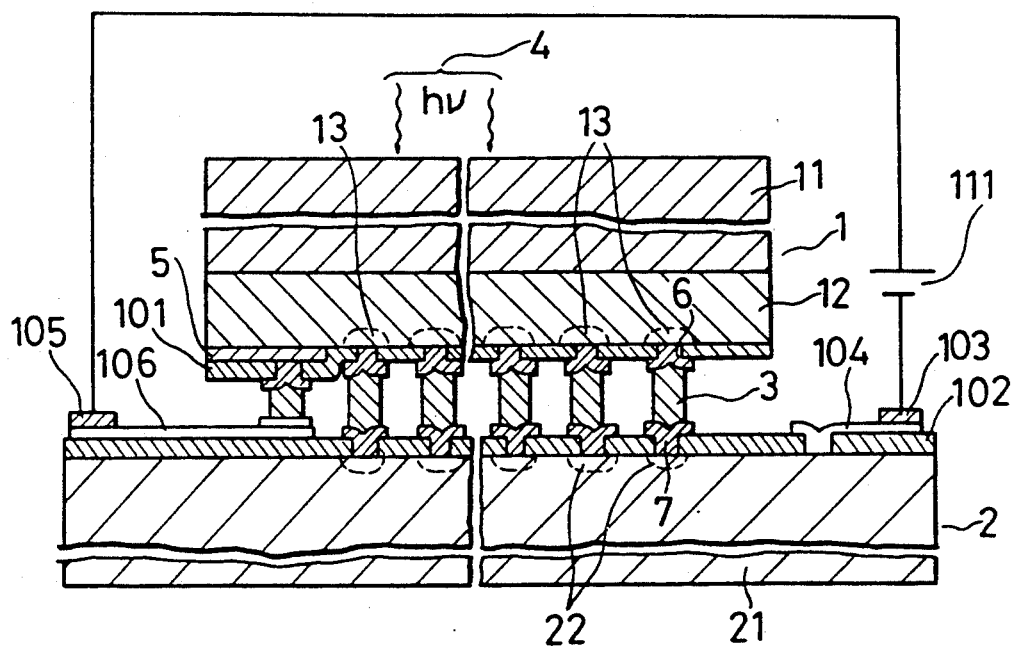

SOLID-STATE HYBRID INFRARED IMAGING DEVICE

FIELD OF THE INVENTION

The present invention relates to solid-state imaging devices and, more particularly, to a solid-state imaging device, whose characteristics are affected by substrate resistance, that can make operating points of pixels in the vicinity of zero bias uniform.

BACKGROUND OF THE INVENTION

FIG. 5 is a perspective view showing a prior art infrared imaging device. In FIG. 5, reference numeral 1 designates a two-dimensional photodiode array, for example, 128×128 array of pixels, which converts lights to electricity to generate signal charges. The photodiode array 1 is mounted on and electrically connected to a silicon CCD 2 for transferring signal charges, via indium bumps 3. Infrared light 4 is incident on the photodiode array 1.

FIG. 6 is a cross-sectional view of the infrared imaging device shown in FIG. 5. In FIG. 6, the same reference numerals as in FIG. 5 designate the same or corresponding parts. A p type HgCdTe layer 12 is disposed on a CdTe substrate 11. A plurality of n type impurity regions 13 are disposed at the surface of the p type HgCdTe layer 12. Each n type impurity region 13 is part of a pixel of the two-dimensional photodiode array 1. A p side electrode 5, which is common to all pixels of the photodiode array, is disposed on the p type HgCdTe layer 12 where the n type impurity regions 13 are not present. An insulating film 101 covers the HgCdTe layer 12 and the p side electrode 5 and apertures corresponding to the n type impurity regions 13 penetrate the insulating film 101. N side electrodes 6 for the pixels are formed in the apertures. N type regions 22 are disposed at the surface of the p type silicon substrate 21 of the silicon CCD 2 and opposed to the pixel regions 13 of the photodiode array 1. The n type regions 22 serve as a signal input stage of the CCD 2. An insulating film 102 having apertures corresponding to the n type regions 22 covers the silicon substrate 21 and electrodes 7 are disposed in the apertures. The n side electrode 6 of each pixel of the photodiode array 1 is connected to the opposite electrode 7 at the input stage of the CCD 2 via a corresponding indium bump 3. The p side electrode 5 is connected to the p type region of the CCD 2 via the indium bumps 3 and a substrate voltage (GND) of the CCD 2 is applied to the p side electrode 5 through the bonding pad 103 and the aluminum wiring 104.

FIG. 7 is a schematic diagram showing a two-dimensional photodiode array. A 3×3 pixel array is employed for simplifying the description. In FIG. 7, the p side electrode 5 is common to all pixels and an n side electrode 6 is provided corresponding to each pixel of the photodiode array 1.

FIG. 8 is a schematic diagram showing a structure of the CCD 2 from the input stage to the CCD channel and the potentials at respective regions. This CCD is a charge storage type CCD having a charge storage region at the input stage. The n side electrode of the photodiode 1 is connected to the n type region 22 of the CCD. An input stage region 25 includes the n type region 22, and an input gate region 26 is adjacent to the input stage region 25. A charge storage region 27 is adjacent to the input gate region 26. A transfer gate region 28 is adjacent to the charge storage region 27. A CCD channel region 29 is adjacent to the transfer gate region 28. An input gate electrode 17 is disposed on the input gate region 26. The potential barrier of the input gate region 26 depends on a DC voltage $V_G$ applied to the input gate electrode 17, whereby the quantity of charge transferred from the input stage region 25 to the storage region 27 is controlled. An electrode 18 forms the potential well, i.e., storage region 27 and a prescribed voltage $V_T$ is applied to the electrode 18. A transfer gate electrode 19 is disposed on the transfer gate region 28. The potential of the transfer gate region 28 is varied by applying a signal $\phi_T$ to the transfer gate electrode 19 with a prescribed timing, whereby the charges stored in the storage region 27 are transferred to the CCD channel region 29. A transfer electrode 20 is disposed on the CCD channel region 29 and a signal $\phi_{CCD}$ is applied to the transfer electrode 20 with a prescribed timing, whereby the charges in the CCD channel region 29 are transferred over CCD channels successively.

FIG. 9 is an electric circuit diagram of the photodiode array 1 shown in FIG. 5. In FIG. 9, reference numeral 9 designates a pixel disposed in the center of the photodiode array 1 and reference numeral 8 designates pixels surrounding the pixel 9. Reference numeral 10 designates substrate resistances (r, R) between those pixels. FIG. 10 shows I - V characteristics of the pixels.

A description is given of the operation. The p side electrode 5, which is common to all pixels, is provided around the pixels and electrically connected to the substrate voltage (GND) of the silicon CCD 2 while the n side electrodes 6 are electrically connected to the silicon CCD 2 via the In bumps 3. The infrared light 4 incident on the photodiode array 1 is converted into signal charges and the signal charges are transferred to the silicon CCD 2 through the indium bumps 3. Thereafter, the signal charges are output as time sequence signals, resulting in picture signals.

By applying a low DC voltage $V_G$ to the input gate electrode 17 of the silicon CCD as shown in FIG. 8, the quantity of charges transferred through the indium bumps can be controlled. Furthermore, a reverse bias voltage $V_{bb}$ is applied to each pixel of the photodiode array 1 according to the DC voltage $V_G$. FIG. 9 shows an electric circuit diagram for explaining the voltage applied to the pixels of the photodiode array 1. In FIG. 9, the distance from the common p side electrode 5 to the peripheral pixel 8 is different from that to the central pixel 9, so that differences arise in the substrate resistances 10, resulting in differences in the reverse bias voltages $V_{bb}$ applied to the pixels. More concretely, when the reverse bias voltages applied to the peripheral pixel 8 and the central pixel 9 are $V_a$ and $V_b$, respectively, and the photoelectric currents flowing through the peripheral pixel 8 and the central pixel 9 are $i_a$ and $i_b$, respectively, the following equations are obtained.

$$V_a = V_{bb} - r(i_a + i_b)$$
$$V_b = V_{bb} - R \cdot i_b - r(i_a + i_b) = V_a - R \cdot i_b$$

As seen from above equations, the reverse bias voltage $V_b$ applied to the central pixel 9 is less than the reverse bias voltage $V_a$ applied to the peripheral pixel 8. When this result is applied to FIG. 10, the operating bias point of the peripheral pixel 8 is different from that of the central pixel 9, resulting in a difference in the output photoelectric current between the peripheral pixel 8 and the central pixel 9. More concretely, less photoelectric current is output from the central pixel 9 than from the peripheral pixel 8.

In the prior art infrared imaging device constituted as described above, there is a non-uniformity in the photoelectric current output from the peripheral pixels and the photoelectric current output from the central pixel. This problem may be solved by forming the p side electrode close to each pixel, but that solution is technically difficult. In addition, since the operating point of the device is its reverse-biased point, the device is easily affected by leakage current.

SUMMARY OF THE INVENTION

The present invention is directed to solving the above-described problems and has for its object to make the photoelectric current uniform and to reduce the leakage current by making the reverse bias voltage applied to each pixel of a photodiode array uniform in the vicinity of zero bias.

According to an aspect of the present invention, a solid-state imaging device includes a photodiode array in which one of the electrodes of a pn junction is common to a plurality of pixels, a signal transfer part transferring charges generated in each pixel region is connected to the other electrode of the photodiode array, and a voltage applying means for applying a voltage in a forward direction is connected to the common electrode of the photodiode array. Therefore, the reverse bias voltage applied to the photodiode due to the voltage applied to the gate at the input stage of the signal transfer part is canceled by the forward voltage applied to the common electrode, so that the operating points of the pixels are uniform in the vicinity of zero bias.

BRIEF DESCRIPTION OF THE DRAWINGS

FIG. 2 is a cross-sectional view showing a structure of the solid-state imaging device in accordance with the first embodiment of the present invention;

DETAILED DESCRIPTION OF THE PREFERRED EMBODIMENTS

Embodiments of the present invention will be described in detail with reference to the drawings.

Figure 1:
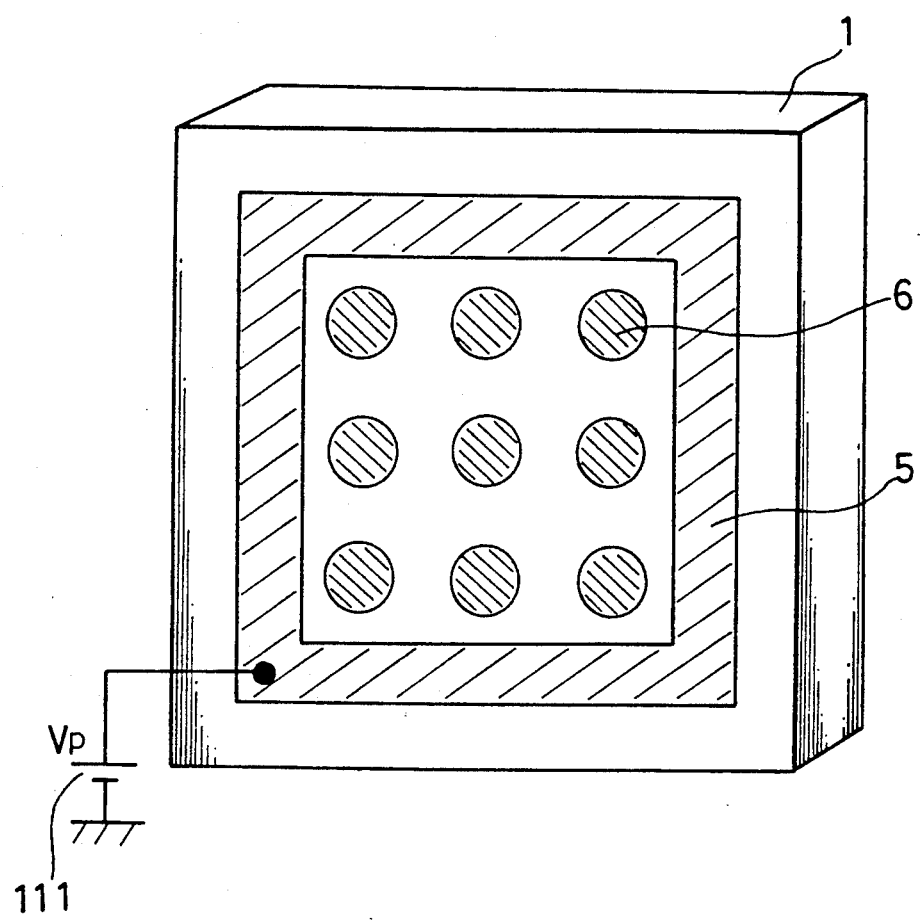
FIG. 1 is a schematic diagram showing a two-dimensional photodiode array of a solid-state imaging device in accordance with a first embodiment of the present invention.
Figure 7:
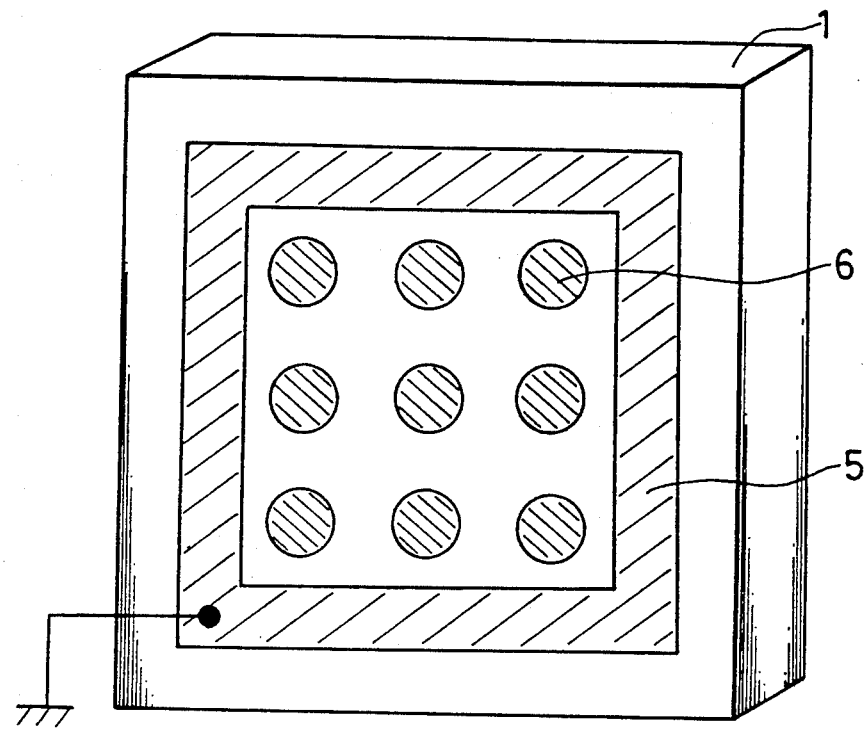
FIG. 7 is a schematic diagram showing a two-dimensional photodiode array of the infrared imaging device in accordance with the prior art.
Figure 8:
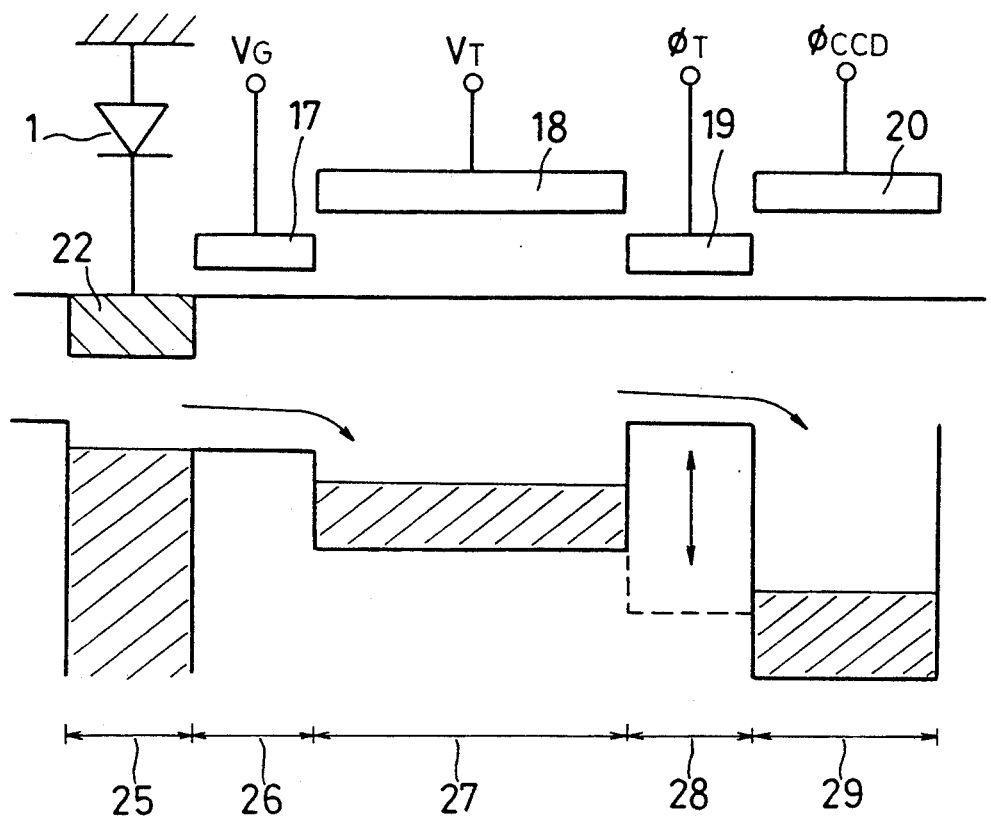
FIG. 8 is a schematic diagram showing a structure of a prior art CCD from the input stage to the CCD channel and the potentials at the respective region.
Figure 9:
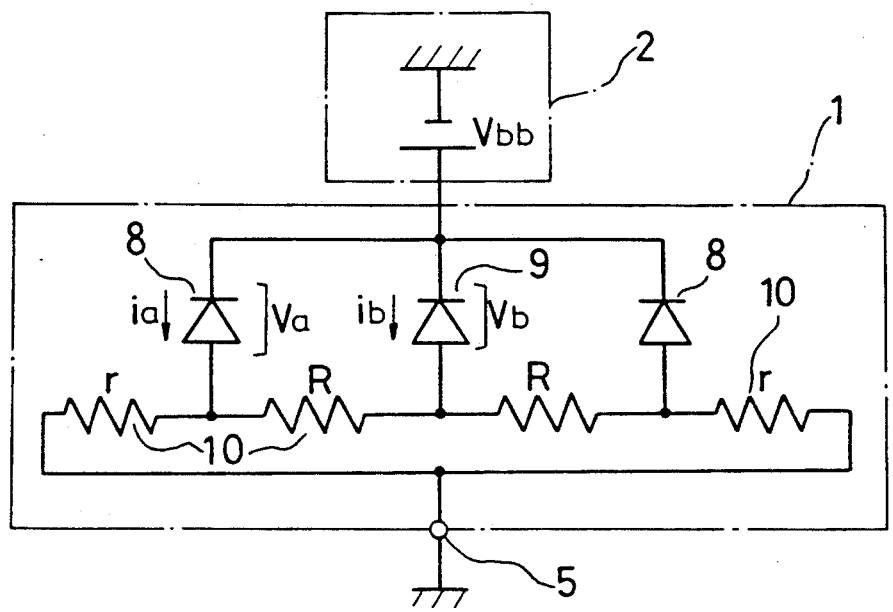
FIG. 9 is an electric circuit diagram for explaining the voltage applied to each pixel of the photodiode array shown in FIG. 7.
Figure 10:
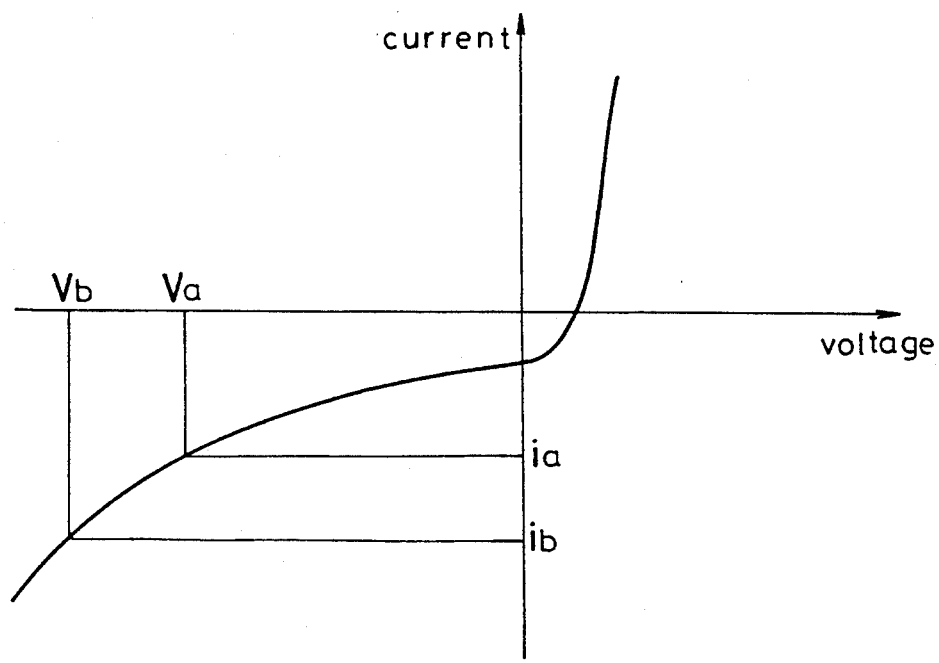
FIG. 10 is a diagram showing an I - V characteristic of each pixel of the photodiode array of the infrared imaging device in accordance with the prior art.

FIG. 1 is a schematic diagram showing a two-dimensional photodiode array of a solid-state imaging device in accordance with a first embodiment of the present invention In FIG. 1, the same reference numerals as in FIG. 7 designate the same or corresponding parts. A p side electrode 5 is common to all pixels and an n side electrode 6 is provided for each pixel of the two-dimensional photodiode array 1. In this embodiment, a DC power source 111 is provided between the common p side electrode 5 and the GND voltage and a prescribed voltage $V_p$ is applied to the p side electrode 5 of the photodiode array.

Figure 6:
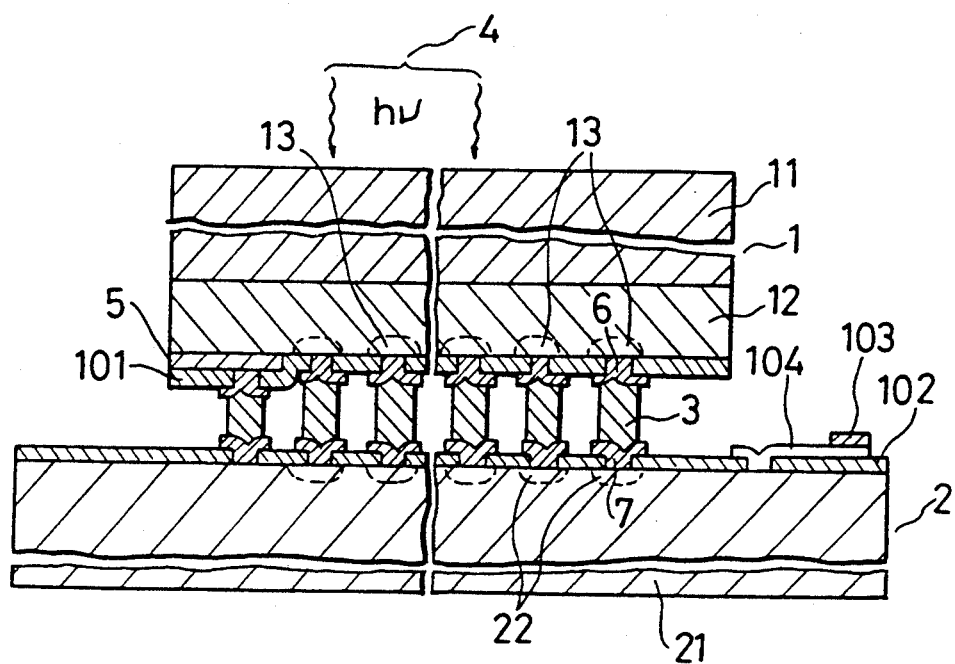
FIG. 6 is a cross-sectional view of the infrared imaging device in accordance with the prior art.

FIG. 2 is a cross-sectional view showing an example of a concrete structure of the solid-state imaging device according to the first embodiment of the present invention. In FIG. 2, the same reference numerals as in FIG. 6 designate the same or corresponding parts. A p type HgCdTe layer 12 is disposed on a CdTe substrate 11. A plurality of n type impurity regions 13 are disposed at the surface of the p type HgCdTe layer 12. Each n type impurity region 13 is part of a pixel region of the two-dimensional photodiode array 1. A p side electrode 5, which is common to all pixels of the photodiode array, is disposed on the p type HgCdTe layer 12 where the n type impurity regions 13 are not present. An insulating film 101 covers the HgCdTe layer 12 and the p side electrode 5 and apertures corresponding to the n type impurity regions 13 penetrate through the insulating film 101. N side electrodes 6 for the pixels are formed in the apertures. N type regions 22 are disposed at the surface of the p type silicon substrate 21 of the silicon CCD 2 and opposed to the pixel regions 13 of the photodiode array 1. The n type regions 22 serve as input stages of the CCD 2. An insulating film 102 having apertures corresponding to the n type regions 22 covers the silicon substrate 21, and electrodes 7 are disposed in the apertures. The n side electrode 6 of each pixel of the photodiode array 1 is connected to the opposite electrode 7 at the input stage of the CCD 2 via a corresponding indium bump 3.

In the first embodiment of the present invention, unlike the prior art device, the p side electrode 5 is not connected to the p type substrate 21 of the CCD 2 but is connected to an Al wiring 106 on the insulating film 102 through the indium bump 3, so that a prescribed voltage $V_p$ is applied to the Al wiring 106 from the DC power source 111 through the bonding pad 105. In addition, the substrate voltage (GND) of the CCD 2 is applied to the p type substrate 21 of the CCD through the bonding pad 103 and the Al wiring 104.

Figure 3:
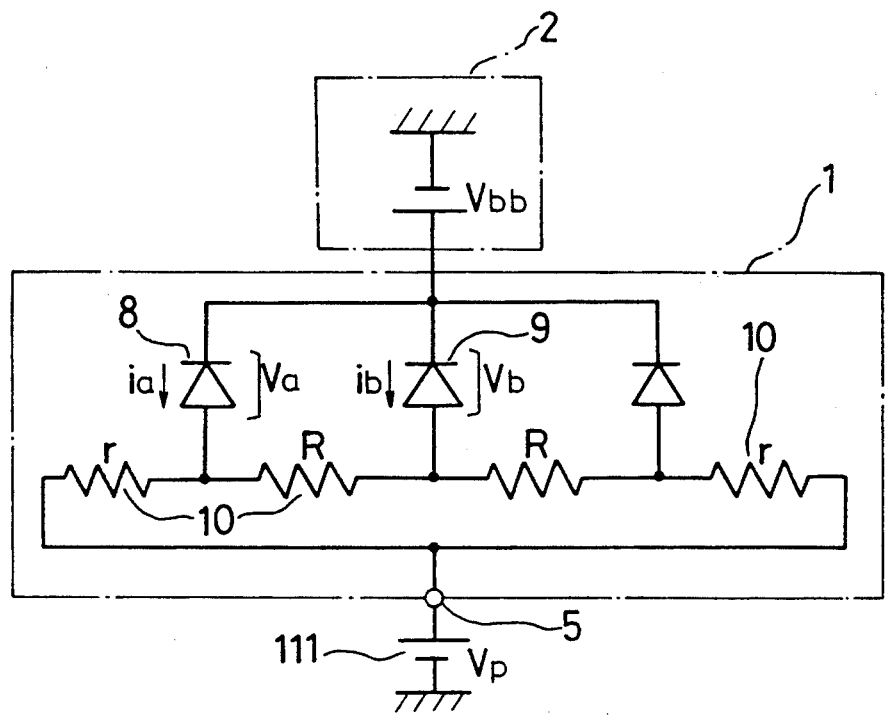
FIG. 3 is an electric circuit diagram for explaining the voltage applied to each pixel of the photodiode array shown in FIG. 1.
Figure 4:
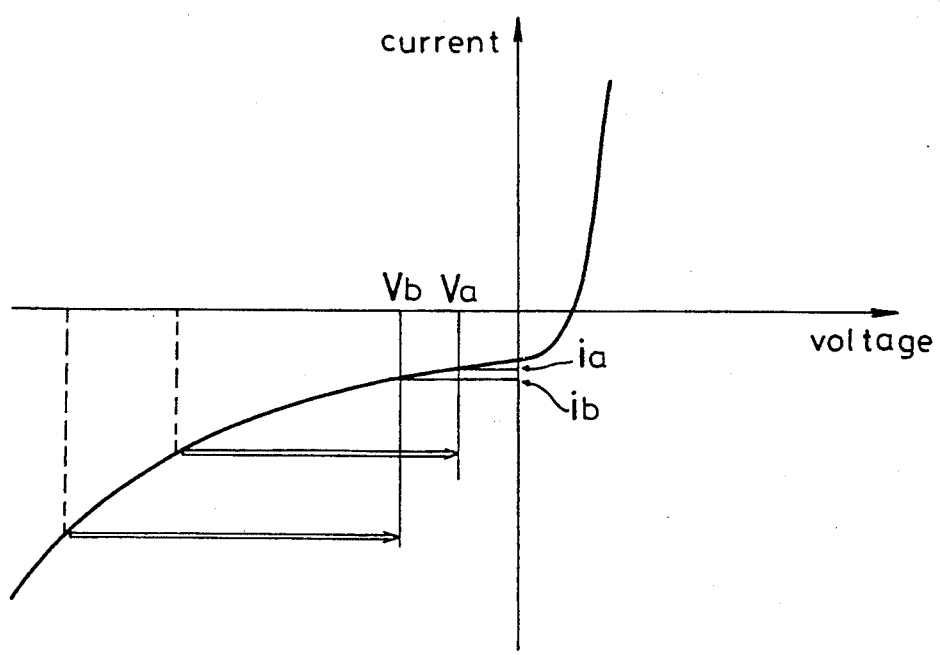
FIG. 4 is a diagram showing an I - V characteristic of each pixel of the photodiode array of the solid-state imaging device in accordance with the first embodiment of the present invention.
Figure 5:
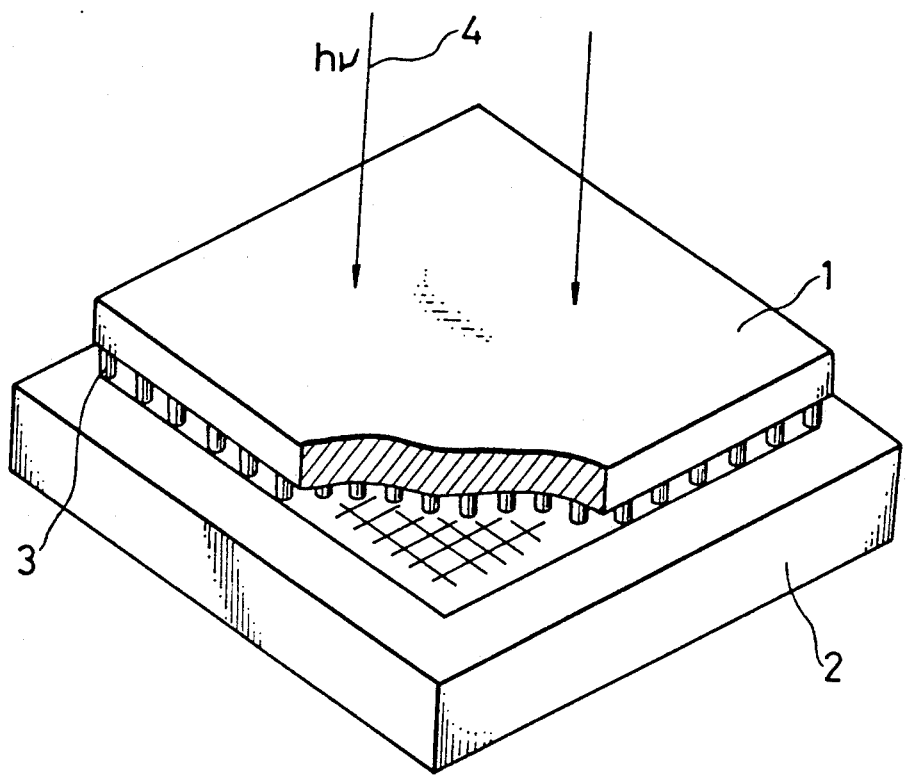
FIG. 5 is a perspective view showing an infrared imaging device in accordance with the prior art.

FIG. 3 is an electric circuit diagram for explaining the voltage applied to each pixel of the photodiode array shown in FIG. 1. In FIG. 3, reference numeral 9 designates a pixel disposed in the center of the photodiode array 1 and reference numeral 8 designates pixels surrounding the central pixel 9. Reference numeral 10 designates substrate resistances (r, R) between those pixels. FIG. 4 shows an I - V characteristic of each pixel of the photodiode array.

A description is given of the operation of the infrared imaging device according to the first embodiment of the present invention, with reference to FIGS. 1 to 4.

Like the prior art device, the infrared light 4 incident on the photodiode array 1 is converted into signal charges and the signal charges are transferred to the silicon CCD 2 through the indium bumps 3. Then, the signal charges are output as time sequential signals, resulting in picture signals. When the voltage $V_P$ applied to the common p side electrode 5 is 0 V, i.e., when it is equal to the substrate voltage of the CCD, this device is equivalent to the prior art device and the reverse bias voltage $V_{bb}$ is applied to each pixel. The reverse bias voltage thus applied depends on the DC voltage applied to the input gate of the CCD. Usually, it is approximately 100 mV. In this embodiment of the present invention, the reverse bias voltage applied to each pixel is varied by applying the voltage $V_P$ to the p side electrode of the photodiode array 1 from the DC power source 111.

More concretely, when the reverse bias voltages applied to the peripheral pixel 8 and the central pixel 9 are $V_a$ and $V_b$, respectively, and the photoelectric currents flowing through the peripheral pixel 8 and the central pixel 9 are $i_a$ and $i_b$, respectively, the following equations are obtained.

$$V_a = V_{bb} - r(i_a + i_b) - V_p$$
$$V_b = V_{bb} - R \cdot i_b - r(i_a + i_b) - V_p = V_a - R \cdot i_b$$

Since $i_b$ decreases with an increase in $V_P$, the difference between $V_a$ and $V_b$ approaches zero. When $V_P$ is equal to $V_{bb}$, i.e., when the effective reverse bias voltage applied from outside becomes zero, the difference between $V_a$ and $V_b$ gets very close to zero and the following equations are obtained.

$$V_a = -r(i_a + i_b)$$
$$V_b = -R \cdot i_b - r(i_a + i_b) = V_a - R \cdot i_b$$

where $i_a$ and $i_b$ take the minimum value.

As shown in FIG. 4, when the difference between $V_a$ and $V_b$ gets closer to zero, the difference between the photoelectric current $i_a$ output from the peripheral pixel 8 and the photoelectric current $i_b$ output from the central pixel 9 is reduced, whereby the variation in the output power is reduced.

In the above-described embodiment of the present invention, the DC voltage, which is approximately equal to the reverse bias voltage $V_{bb}$ applied to the pixels of the photodiode array 1, is applied to the common p side electrode 5. Therefore, the operating points of the pixels can be make uniform in the vicinity of the zero bias, so that variations in the photoelectric current output from the pixels are reduced and influences due to leakage current are reduced.

Figure 11:
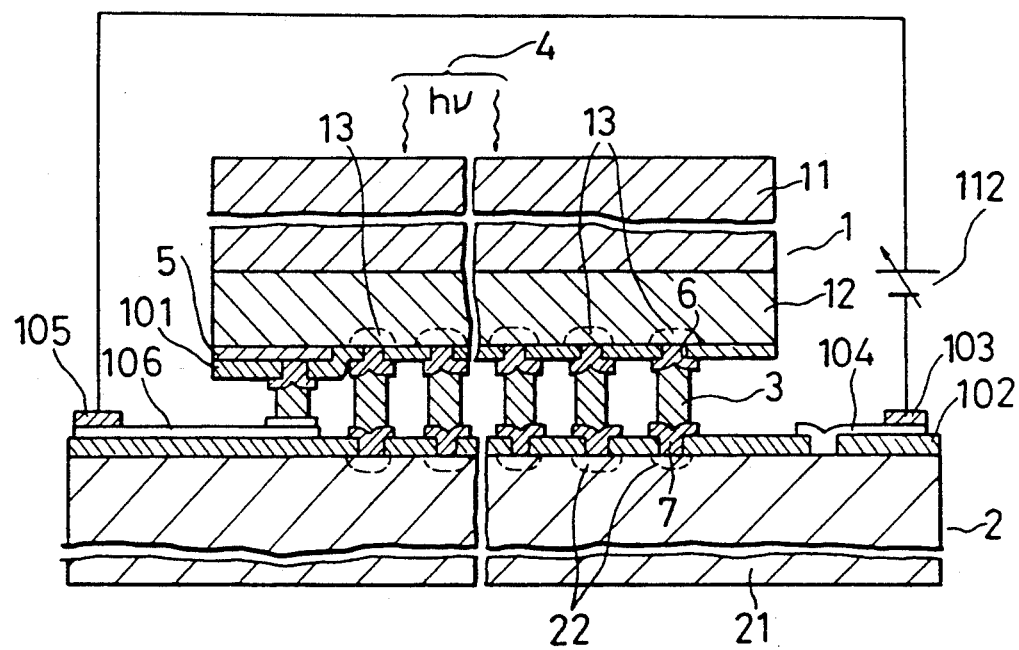
FIG. 11 is a cross-sectional view showing a solid-state imaging device in accordance with a second embodiment of the present invention.

Although the DC power source 111 used above supplies a fixed voltage, when a DC power source 112 which supplies a variable voltage is used as shown in FIG. 11, the photodiode 1 can be used at a desired bias voltage. Thereby, the device can operate with the optimum characteristics at all times.

While in the above-described embodiment the DC power source 111 is used for adjusting the voltage applied to the common p side electrode 5, another means may be used so long as it serves as desired.

In addition, while in the above-described embodiment an infrared imaging device is described, the present invention can be applied to any solid-state imaging devices, whose characteristics are affected by the substrate resistance, with the same effects as described above.

As is evident from the foregoing description, according to the present invention, a solid-state imaging device includes a photodiode array in which either electrode of the pn junctions is common to a plurality of pixels, a signal transfer part transferring charges generated in each pixel region is connected to the other electrode of the pn junctions of the photodiode array, and a voltage applying means for applying a voltage in a forward direction to the pn junction of the photodiode is connected to the common electrode of the photodiode array. Therefore, the reverse bias voltage applied to the photodiodes due to the voltage applied to the gate at the input stage of the signal transfer part is canceled by the forward voltage applied to the common electrode, so that the operating points of the pixels are made uniform near the zero bias point. As a result, variations in the photoelectric current output from the pixels of the photodiode array are reduced and influences due to the leakage current are reduced.

We claim:

1. A solid-state imaging device comprising:
   a photodiode array having a plurality of pixels comprising a plurality of second conductivity type regions in a first conductivity type semiconductor layer, thereby forming a plurality of pn junctions, and an electrode common to all of said pixels and disposed on said first conductivity type semiconductor layer;
   a signal transfer means for transferring signal charges generated in said pixels in response to incident light, said signal transfer means being connected to said second conductivity type regions; and
   DC voltage applying means for applying a DC voltage in a forward direction to said plurality of junctions.

2. A solid-state imaging device in accordance with claim 1 including first and second substrates, connecting bumps, and a signal input stage as part of said signal transfer means for receiving signal charges produced by said pixels in response to incident light wherein said photodiode array and said signal transfer means are formed on said first and second substrates, respectively, and each pixel has a second electrode connected to said signal input stage of said signal transfer means via said bumps.

3. A solid-state imaging device in accordance with claim 2 wherein said DC voltage applying means is a DC power source connected to said common electrode and said second substrate.

4. A solid-state imaging device in accordance with claim 3 wherein a reverse bias voltage applied to a pixel through said signal input stage is canceled by the voltage applied by said DC power source.

5. A solid-state imaging device in accordance with claim 3 wherein said DC power source supplies a variable voltage.

6. A solid-state imaging device in accordance with claim 1 wherein said first conductivity type semiconductor layer comprises cadmium mercury telluride and said signal transfer means comprises a silicon semiconductor device structure.

* * * * *